United States Patent
Morales

(10) Patent No.: US 9,372,518 B1
(45) Date of Patent: Jun. 21, 2016

(54) POWER DISTRIBUTION SYSTEM WITH RACK POWER DISTRIBUTION UNIT

(71) Applicant: Amazon Technologies, Inc., Reno, NV (US)

(72) Inventor: Osvaldo P. Morales, Seattle, WA (US)

(73) Assignee: Amazon Technologies, Inc., Reno, NV (US)

( * ) Notice: Subject to any disclaimer, the term of this patent is extended or adjusted under 35 U.S.C. 154(b) by 592 days.

(21) Appl. No.: 13/769,777

(22) Filed: Feb. 18, 2013

Related U.S. Application Data

(62) Division of application No. 12/501,287, filed on Jul. 10, 2009, now Pat. No. 8,378,530.

(51) Int. Cl.
*H01B 7/30* (2006.01)
*G06F 1/26* (2006.01)
*H02J 3/00* (2006.01)

(52) U.S. Cl.
CPC .... *G06F 1/26* (2013.01); *H02J 3/00* (2013.01)

(58) Field of Classification Search
CPC ..................................... G06F 1/26; H02J 3/00
See application file for complete search history.

(56) References Cited

U.S. PATENT DOCUMENTS

| | | | |
|---|---|---|---|
| 4,060,735 A | 11/1977 | Pascucci et al. | |
| 5,675,194 A | 10/1997 | Domigan | |
| 6,992,247 B2 | 1/2006 | Rasmussen et al. | |
| 7,560,831 B2 | 7/2009 | Whitted et al. | |
| 7,851,950 B1 | 12/2010 | Morales | |
| 7,859,376 B2 | 12/2010 | Johnson | |
| 8,902,569 B1* | 12/2014 | Wishman et al. | 361/622 |
| 2007/0046103 A1* | 3/2007 | Belady et al. | H02G 3/00 307/12 |

OTHER PUBLICATIONS

Rasmussen, Neil. "Increasing data center efficiency by using improved high density power distribution." APC White Paper 128 (2006).*

* cited by examiner

*Primary Examiner* — Daniel Cavallari
(74) *Attorney, Agent, or Firm* — Robert C. Kowert; Meyertons, Hood, Kivlin, Kowert & Goetzel, P.C.

(57) ABSTRACT

A power distribution system for a data center includes a transformer that transforms three-phase source power to three-phase operating power. The phase-to-neutral operating voltage for each phase is at least about 260 volts. Power distribution units are coupled to the transformer. The power distribution units supply operating power from the transformer to computer systems in the data center.

19 Claims, 9 Drawing Sheets

POWER DISTRIBUTION SYSTEM WITH RACK POWER DISTRIBUTION UNIT

This application is a Divisional of U.S. patent application Ser. No. 12/501,287, filed Jul. 10, 2009, now Issued U.S. Pat. No. 8,378,530, which is hereby incorporated by reference in its entirety

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carried out an organization's operations. Typically, a computer room of a computing facility includes many server racks. Each server rack, in turn, includes many servers and associated computer equipment.

Because the computer room of a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 110V). A network of cabling, bus bars, power connectors, and power distribution units, is used to deliver the power at the lower voltage to numerous specific components in the facility. The number and length of conductors for required for a computer room can create substantial inefficiencies in power delivery to the components, specifically in the form of heat dissipated from the conductors. In addition, the amount of current any one wire can carry is limited by the size of the wire, insulation characteristics, and other factors.

Figure 1:
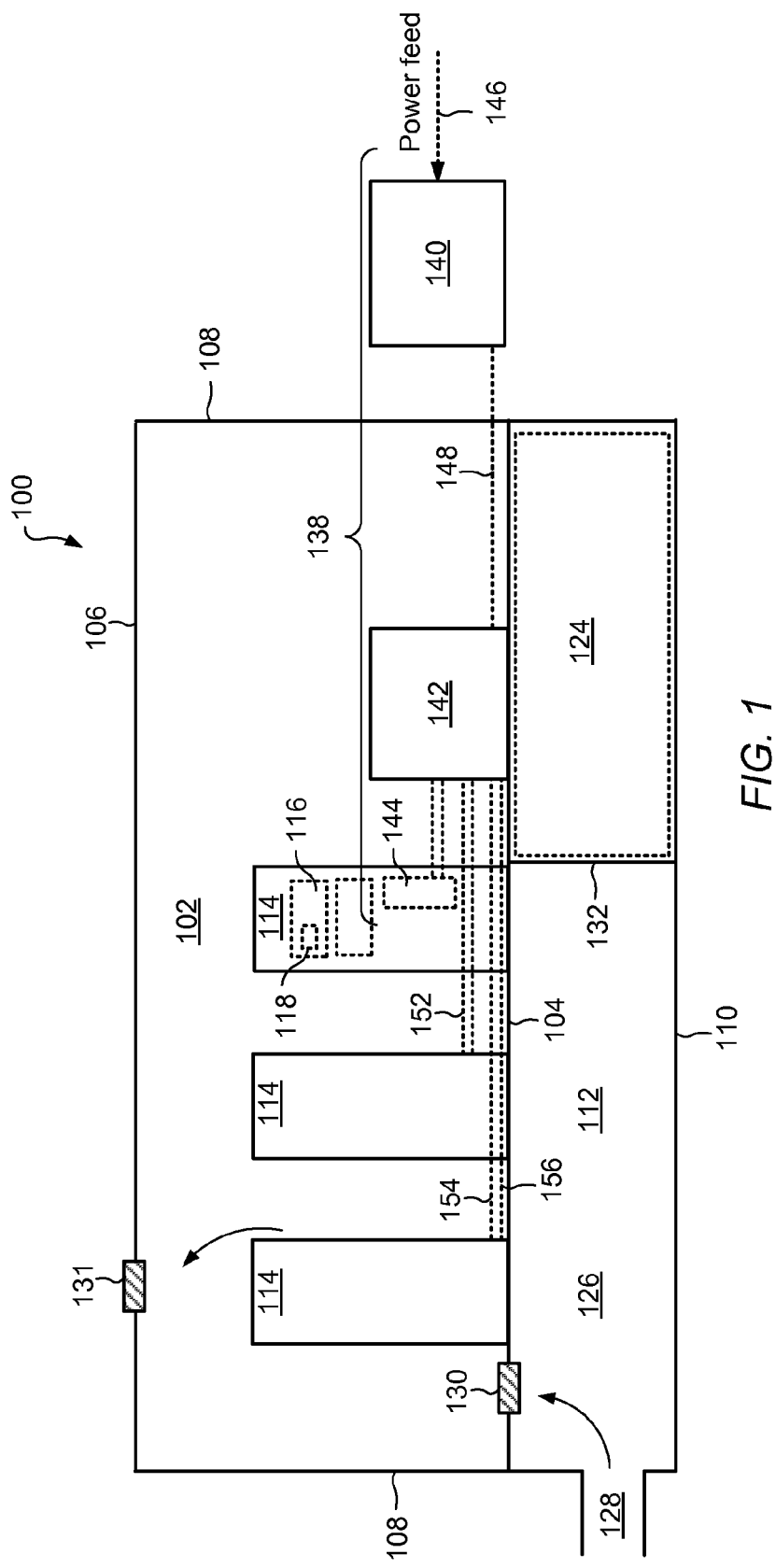
FIG. 1 is a schematic view illustrating one embodiment of a power distribution system with a step-down transformer in a computer room of a data center.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of power distribution system for computer systems in a computer room of a data center are disclosed. According to one embodiment, a power distribution system for a data center includes a transformer that transforms three-phase source power to three-phase operating power. The phase-to-neutral operating voltage for each phase is at least about 260 volts. Rack power distribution units are coupled to the transformer. The rack power distribution units supply operating power from the transformer to computer systems in the data center. In one embodiment, the line-to-line voltage of the source power is about 480 volts and the phase-to-neutral voltage of the operating power to the rack power distribution units is about 277 volts. In certain embodiments, the transformer includes secondary windings in a Y configuration. In certain embodiments, three-phase source power is transmitted from a first stage transformer directly to a rack-mounted power distribution unit. In certain embodiments, the power distribution system includes an autotransformer. The autotransformer may drive a neutral for the operating power.

According to one embodiment, a data center includes computer systems in rack of a computer room, a transformer, and a power distribution unit. The computer systems include power supplies that operate at input voltages of at least 260 volts. The transformer transforms three-phase source power to three-phase operating power at a phase-to-neutral operating voltage on each leg of at least about 260 volts. The power distribution unit supplies operating power from the transformer to the power supplies for the computer systems. In some embodiments, the source power is a utility feed, and the transformer is the only transformer coupled between the utility feed and the power distribution units. In one embodiment, the three-phase operating power has a phase-to-neutral voltage of about 277 volts.

According to one embodiment, a method of supplying power to computer systems in a computer room includes providing computer system power supplies that can accept input voltages of at least about 260 volts. Three-phase source power from a source power feed is transformed to three-phase operating power having a phase-to-neutral voltage below the maximum acceptable range of the power supplies but at least about 260 volts. The three-phase operating power is transmitted to power distribution units in racks in the computer room. Operating power from the power distribution units is distributed to the power supplies.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, "computer room" means a room of a building in which computer systems, such as rack-mounted servers, are operated.

As used herein, "operating power" means power that can be used by one or more computer system components. Operating power may be stepped down in a power distribution unit or in elements downstream from the power distribution units. For example, a server power supply may step down operating power voltages (and rectify alternating current to direct current).

As used herein, "wye transformer" or "Y transformer" refers to a transformer whose secondary windings are in a wye, or Y, configuration.

As used herein, "delta transformer" refers to a transformer whose secondary windings are in a delta configuration.

As used herein, "autotransformer" refers to a transformer having only one winding per phase. As used herein, "multi winding transformer" means a transformer that has a primary winding and a secondary winding for at least one phase.

As used herein, "rack power distribution unit" refers to any module, device, assembly, or combination of components, such as wiring, bus bars, connectors, that can be used to distribute electrical power to various components in a rack.

As used herein, "power distribution unit" refers to any device, module, component, or combination thereof, that can be used to distribute electrical power. The elements of a power distribution unit may be embodied within a single component or assembly (such as a transformer and a rack power distribution unit housed in a common enclosure), or may be distributed among two or more components or assemblies (such as a transformer and a rack power distribution unit each housed in separate enclosure, and associated cables, etc.)

As used herein, "source power" includes power from any source, including but not limited to power received from a utility feed. In certain embodiments, "source power" may be received from the output of another transformer (which is sometimes referred to herein as "intermediate power").

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

FIG. 1 is a schematic view illustrating one embodiment of a data center. Data center 100 includes computer room 102. Computer room 102 includes raised floor 104, ceiling 106, and walls 108. Raised floor 104 is elevated relative to lower floor 110. Lower space 112 is formed between raised floor 104 and lower floor 110.

Computer room 102 includes at least one equipment rack system, or rack 114. Racks 114 may be substantially similar to one another with the exception of a configuration of electronic components within each of the racks 114. Although three racks 114 are shown in FIG. 1, a computer room may have only one or two racks, or many racks. Racks 114 may house servers 116 and various other components. Servers 116 may include power supplies 118.

Lower space 112 includes lower equipment space 124 and plenum space 126. Equipment space 124 may house various components including power distribution equipment, cabling, power buses, power terminals, data buses, data terminals, and spares. Plenum space 126 may receive cooling air from supply duct 128. Supply duct 128 may supply cooling air from an air handling system for the data center. Cooling air may be vented from plenum space 126 through floor vents 130 in raised floor 104. The cooling air may pass through and/or over racks 114 and exit computer room 102 through ceiling vents 131 in ceiling 106.

In FIG. 1, lower equipment space 124 and plenum space 126 are separated by wall 132. In other embodiments, there may be no physical barrier between equipment and the cooling air.

Racks 114 may be supplied with power from a source power feed to data center 100 through power distribution system 138. Power distribution system 138 includes first stage transformer 140, second stage transformer 142, and rack power distribution units 144. Rack power distribution units may distribute power to power supplies 118 in servers 116.

First stage transformer 140 may be located outside of computer room 102. In certain embodiments, first transformer 140 may be in lower equipment space 124. First stage transformer 140 is coupled to source power feed through source power lines 146. In one embodiment, the source power feed is a three-phase feed having nominally 13.5 kilovolts on each phase. First stage transformer 140 may step down the source power to a lower voltage. In one embodiment, first stage transformer steps down the voltage to 480 volts line-to-line. In one embodiment, first stage transformer 140 is a delta transformer (e.g., with both primary and secondary windings connected in a delta configuration). In one embodiment, first stage transformer 140 is a single, Y-transformer.

Second stage transformer 142 is located in computer room 102. Second stage transformer 142 is coupled to first stage transformer 140 by way of intermediate power lines 148. In an embodiment, each of intermediate power lines 148 includes one or more 8-gauge insulated wires. Intermediate power lines may include one or more hot lines. In certain embodiments, intermediate power lines may include one or more neutral lines and one or more ground lines. In certain embodiments, intermediate power may include neither a ground line nor a neutral line. Intermediate power lines 148 may be routed between first stage transformer 140 and second stage transformer 142 on, under, or above floor 104 of computer room 102. Transformer 204 may step three-phase intermediate power from transformer 202 down to operating power (e.g. "floor" power). In one embodiment, the operating power may be at a line-to-neutral voltage of between about 220 volts and about 260 volts.

Rack power distribution units 144 are coupled to second stage transformer 146 by way of operating power lines 152. In one embodiment, each of operating power lines 148 includes one or more 8-gauge insulated wires. Operating power lines 152 hot lines 154, neutral lines 156 and a ground line. In other embodiments, however, operating power lines 152 may include neither a ground line and or neutral line. In some embodiments, ground from racks 114 may be provided by a direct or indirect connection to the structure of the building. This ground may be in addition to, or instead of, a ground line through first stage transformer 140 or second stage transformer 142. Operating power lines 152 may be routed between second stage transformer 142 and racks 114 in conductors running through, under, or above computer room 102, or a combination thereof. Operating power lines 152 may include insulated wires, buses, electrical connectors, electrical terminals, or combinations thereof.

Figure 2:
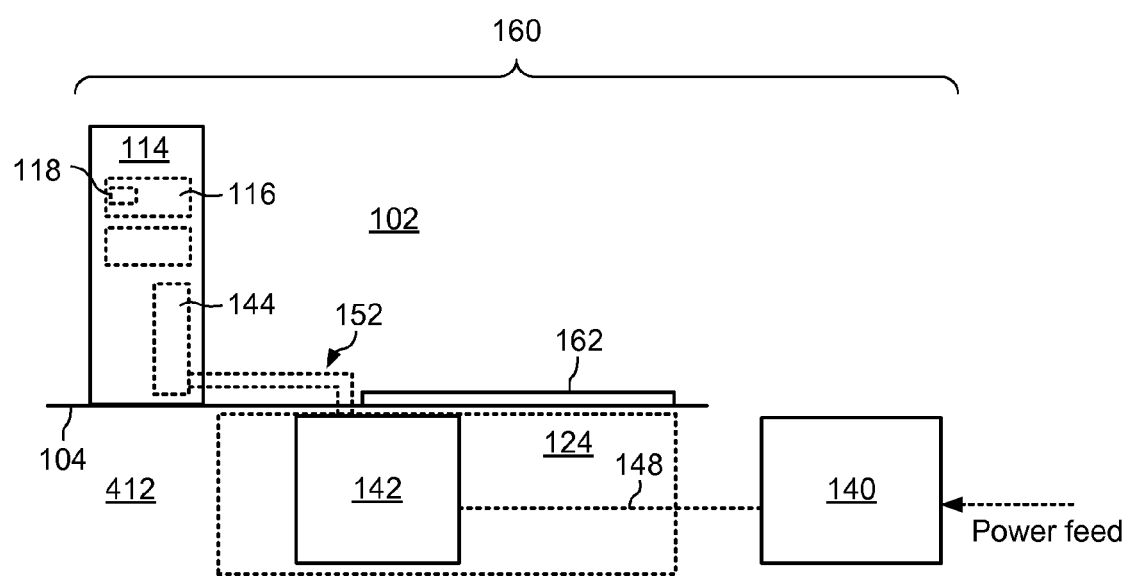
FIG. 2 is a schematic view illustrating one embodiment of a power distribution system with a step down transformer under a computer room of a data center.

FIG. 2 illustrates an alternate embodiment of a power distribution system in a data center. Power distribution system 160 includes second stage transformer 142 is located in lower equipment space 124 below raised floor 104. Raised floor 104 includes access panel 160. Access panel 162 may be opened or removed as needed for maintenance of second stage transformer 142 and other equipment in lower equipment space 124. Other portions of power distribution system 160 may be similar to those shown in FIG. 1.

In some embodiments, a power distribution unit receives a power input directly from a first stage transformer of a power distribution system. The input to the power distribution unit may be at a standard voltage.

Figure 3:
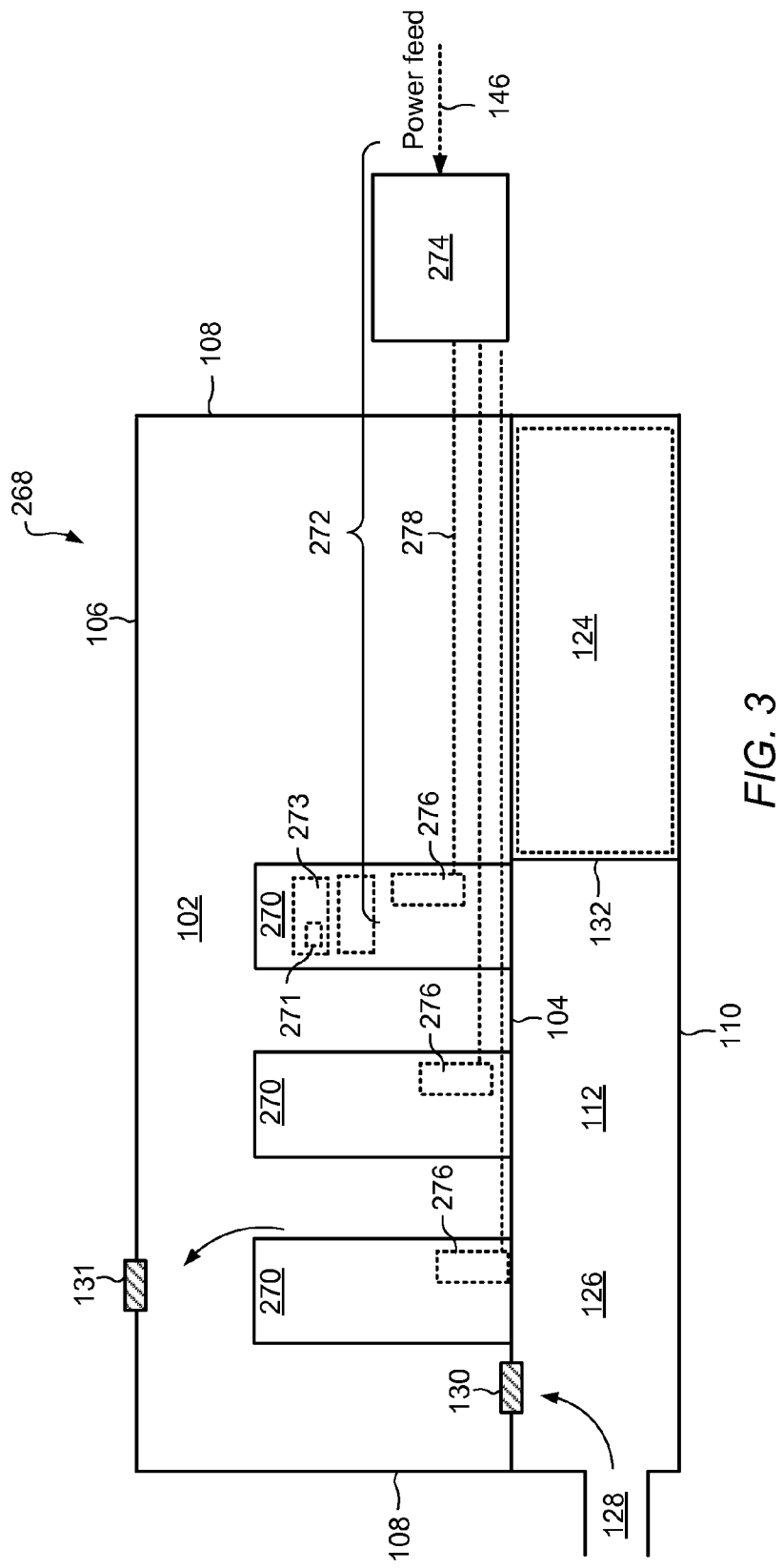
FIG. 3 is a schematic diagram illustrating an embodiment of a data center power distribution system having a power distribution unit with a Y transformer.

In one embodiment, a rack-level power distribution unit receives three-phase power directly from a first stage transformer system. FIG. 3 is a schematic illustrating an embodiment of a data center that includes a transformer system coupled to rack power distribution units. Data center 268 includes racks 270. Racks 270 may be supplied with power from a source power feed to data center 268 through power distribution system 272. Power distribution system 272 includes transformer system 274 and rack power distribution units 276.

Transformer system 274 is coupled to source power feed through source power lines 146. In one embodiment, the source power feed is a three-phase feed having nominally 13.5 kilovolts on each phase. Transformer system 274 may step-down the source power to a lower voltage. In some embodiments, power distribution system 272 includes a Y transformer. In one embodiment, transformer 274 is a delta transformer (e.g., with both primary and secondary windings connected in a delta configuration). In one embodiment, rack power distribution units 276 are coupled to transformer 274 by way of operating power lines 278. In one embodiment, operating power lines 278 carry three-phase current, 480-volt output, 277 volts per phase, and a neutral output. Transformer system 274, and/or or the components thereof, may be physically located, in various embodiments, in a switchgear room, in an electric room, or outside of a data center building.

Power distribution units 276 may distribute power to power supplies 271 in servers 273 of rack 270. In some embodiments, power supplies 271 are capable of operating at input voltages above that of some standard power supplies (which may have maximum allowable input voltage of about 250 volts or less, for example). In one embodiment, power supplies 271 in servers 273 have maximum input voltages of more than 260 volts. In one embodiment, power supplies 271 have maximum input voltages of about 346 volts or more. In one embodiment, power supplies 271 have maximum input voltages of about 254 volts or more.

A direct coupling of a power distribution unit to a first stage transformer system, such as shown in FIG. 3, may eliminate a need for one or more intermediate transformer stages in a power distribution system. In power distribution system 268 shown in FIG. 3, for example, the intermediate transformer unit in the position of second stage transformer 142 shown in FIGS. 1 and 2 (i.e., between first stage transformer 140 and rack power distribution unit 144) has been eliminated. As an example, in FIG. 1, transformer 140 may supply power to transformer 142 at 480 volts line-to-line and transformer 142 may in turn supply power to rack power distribution units 144 at 220 to 260 volts phase-to-neutral voltage, whereas, in FIG. 3, transformer system 274 may supply power to power distribution units 276 at 480 volts line-to-line, 277 volt line-to-neutral, voltage.

Figure 4:
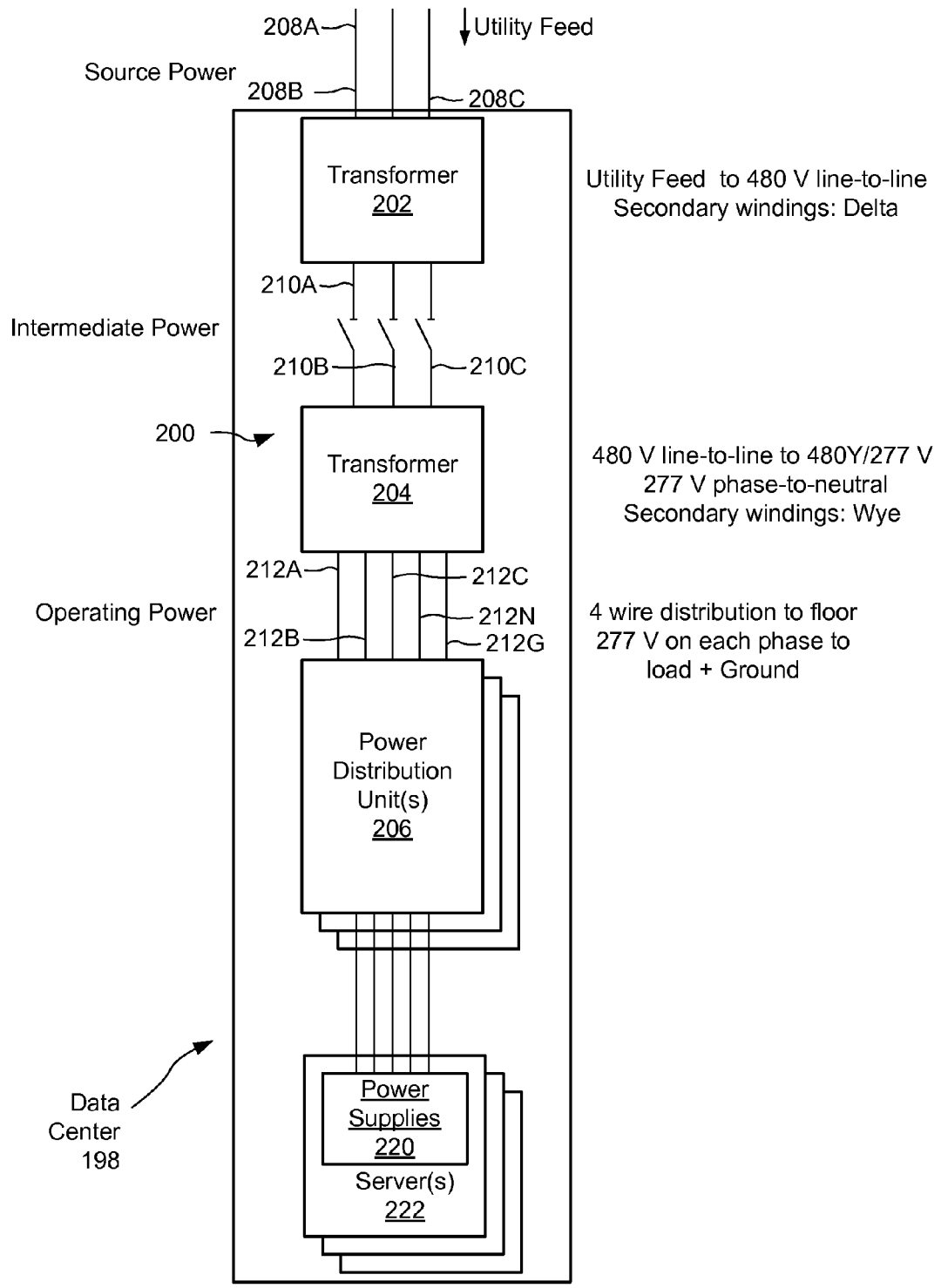
FIG. 4 is a schematic diagram illustrating one embodiment of a power distribution system with power distribution units coupled to a first stage transformer.

FIG. 4 is a schematic illustrating one embodiment of a data center including a power distribution system. Data center 198 includes power distribution system 200. Power distribution system 200 includes transformer 202, transformer 204 and power distribution units 206. Transformer 202 is coupled to a utility feed. The utility feed may be a medium voltage feed. In certain embodiments, the utility feed is at a voltage of about 13.5 kilovolts or 12.8 kilovolts at a frequency of about 60 Hz. In one embodiment, source power lines 208A, 208B, and 208C are aluminum conductors.

In one embodiment, transformer 202 steps down voltages from the three-phase utility feed to intermediate power at intermediate line-to-line voltages of about 480 V. In some embodiments, transformer 202 may be implemented as a series of two or more transformers that step down the voltage incrementally. For example, one transformer may step down a feed voltage at 60+ kilovolts to a voltage between 5 kilovolts and 10 kilovolts. A second transformer may further step down from line-to-line voltages of between 5 kilovolts and 10 kilovolts to line-to-line voltages at about 480 volts. Intermediate power may be transmitted via intermediate power lines 210A, 210B, and 210C.

Transformer 204 may transform three-phase intermediate power from transformer 202 to operating power (e.g. "floor" power). The operating power may be at a line-to-line voltage of about 480 volts and a phase-to-neutral voltage of about 277 volts. Transformer 204 may be a wye transformer. In one embodiment, transformer 204 has primary windings in a delta configuration and secondary windings in a wye configuration.

The voltages described herein may be within typical manufacturing tolerances for transformers in power distribution applications and may be dependent on the particular transformer winding configuration and materials. In one embodiment, phase-to-neutral voltages of the operating power lines may be within a range of about +/−10 volts.

The output power from transformer 204 is transmitted via one or more sets of phase lines 212A, 212B, and 212C, and neutral line 212N to one or more power distribution units 206. In one embodiment, each of phase lines 212A, 212B, and 212C may carry up to about 24 amps. In one embodiment, each of phase lines 212A, 212B, and 212C may carry up to about 32 amps. In one embodiment, each of phase lines 212A, 212B, and 212C may carry up to about 42 amps. In an embodiment, the total output for each power distribution unit 206 may be about 20 kVA. Transformer 204 also includes ground line 212G. Computer system components may also be grounded to the floor structure of the computer room (either by conductors or through the structure of the rack in which they are enclosed). In certain embodiments, ground line 212G is omitted.

Power distribution units 206 are coupled to one or more server power supplies 220 in servers 222. Various of servers 222 in a system may operate on different phases of power distribution system 200. In some embodiments, server power supplies 220 are configured to receive power at variable input voltages. In one embodiment, server power supplies 220 can accept input voltages up to about 277 V. In one embodiment, server power supplies 220 can accept input voltages up to 260 V. In another embodiment, server power supplies 220 can accept input voltages up to 240 V. In certain embodiments, transformers for a power distribution system are selected such that operating power to variable server power supplies is near the maximum input voltage specification for the server power supplies.

Figure 5:
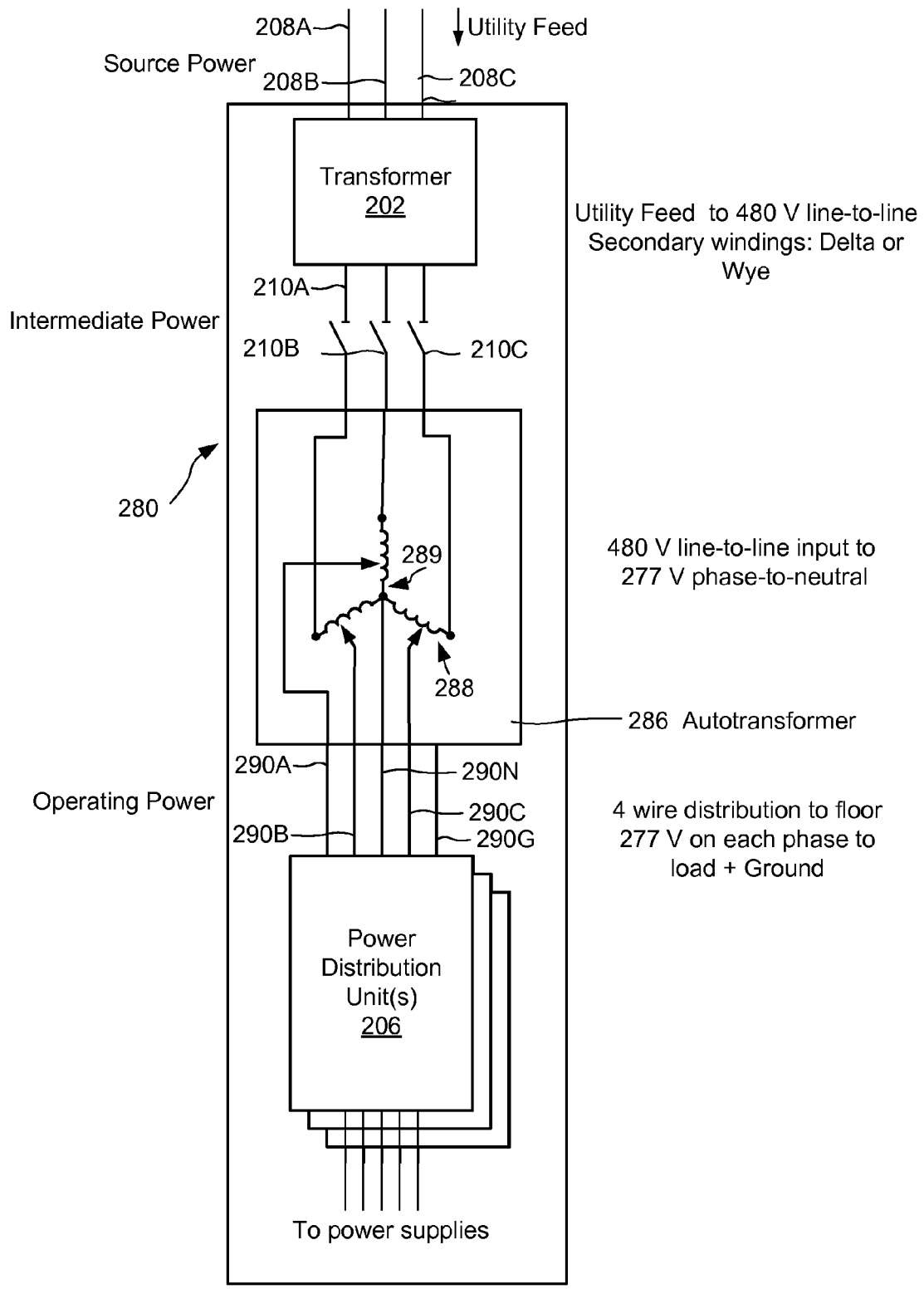
FIG. 5 is a schematic diagram illustrating an embodiment of a data center power distribution system having a power distribution unit with an autotransformer.

In some embodiments, a power distribution system for a data center includes an autotransformer. The autotransformer may provide operating power to computer systems in the data center via power distribution units. FIG. 5 is a schematic illustrating one embodiment of a power distribution system including a three-phase autotransformer. Power distribution system 280 includes transformer 202, autotransformer 286 and power distribution units 206. Autotransformer 286 includes windings 288 having a common terminal at 289. Autotransformer 286 may receive three-phase input power from transformer 202 via lines 210A, 210B, and 210C. Autotransformer 286 may transform three-phase power from transformer 202 to operating power (e.g. "floor" power). Autotransformer 286 may drive neutral 290N. Outputs for autotransformer 286 includes phase lines 290A, 290B, and 290C, and ground 290G. In one embodiment, the operating power from autotransformer 286 is at a line-to-line voltage of about 480 volts and a phase-to-neutral voltage of about 277 volts. In other embodiments, an autotransformer transforms input power down to operating voltages within the input voltage range specifications for components of the system, such as power supplies in server racks. In one embodiment, for example, autotransformer 286 transforms input power at line-to-line voltages of about 480 volts down to operating power at phase-to-phase voltages between about 380 volts and about 450 volts and phase-to-neutral voltages between about 220 volts and about 260 volts. In another embodiment, autotransformer 286 transforms input power at line-to-line voltages of about 480 volts to operating power at phase-to-phase voltages between about 380 volts and about 420 volts and phase-to-neutral voltages between about 222 volts and about 242 volts. The nominal phase-to-neutral voltages of the operating power lines may be, for example, about 232 volts +/−10 volts.

Figure 6:
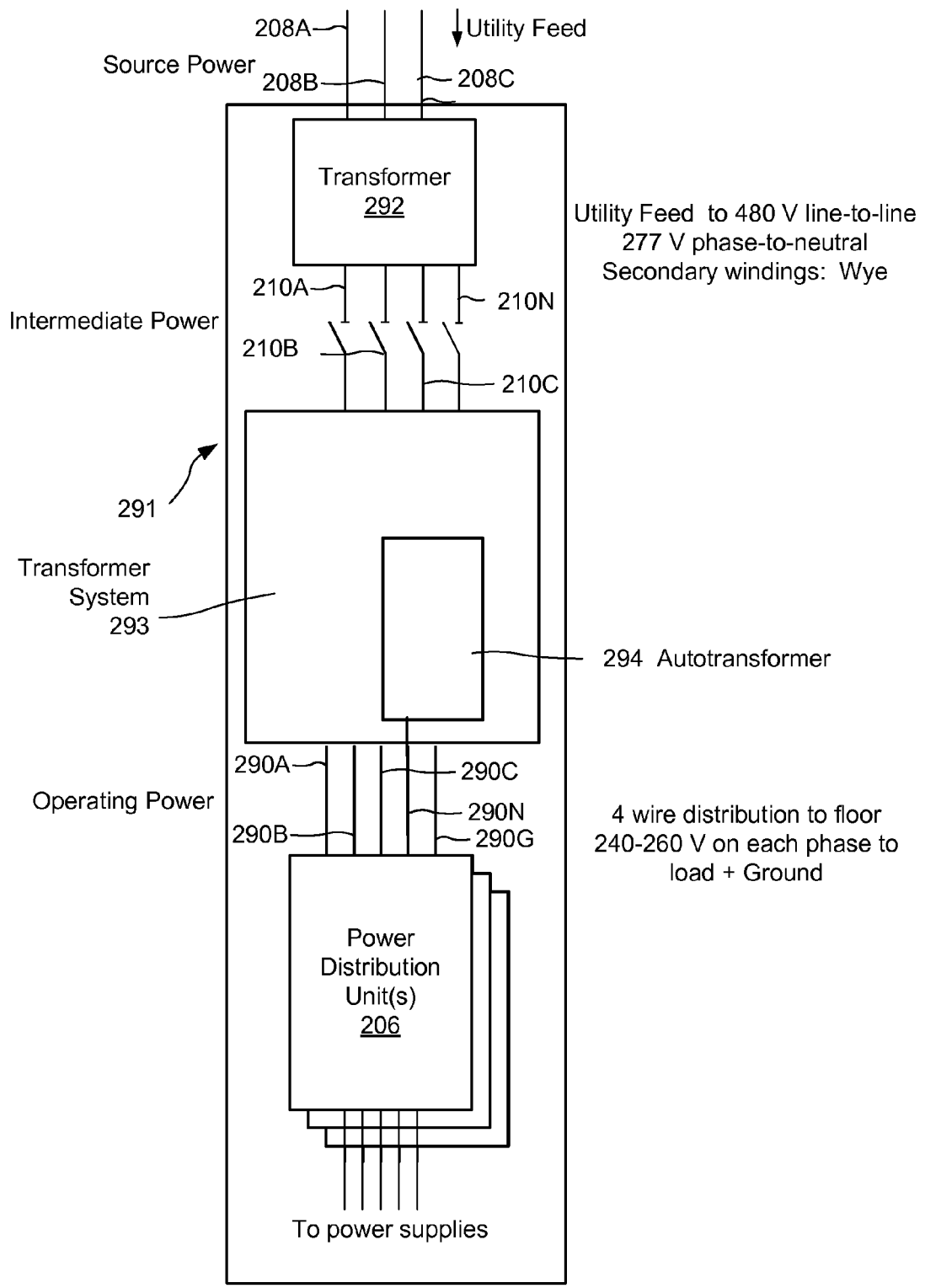
FIG. 6 is a schematic illustrating an alternate embodiment of a power distribution system including an autotransformer.

FIG. 6 is a schematic illustrating an alternate embodiment of a power distribution system including an autotransformer. Power distribution system 291 includes transformer 292, transformer system 293, and power distribution units 206. Transformer system 293 includes autotransformer 294. Autotransformer drives neutral output 290N of transformer system 293. Autotransformer may be used to achieve a desired phase-to-neutral output voltage of transformer system 293. For example, system 293 may receive input voltage at 277 volts phase-to-neutral. Autotransformer may be tapped to adjust the output phase-to-neutral voltage relative to that of the input phase to neutral voltage. For example, in one embodiment, the phase-to neutral output voltage of transformer system 293 is about 240 volts.

Figure 7:
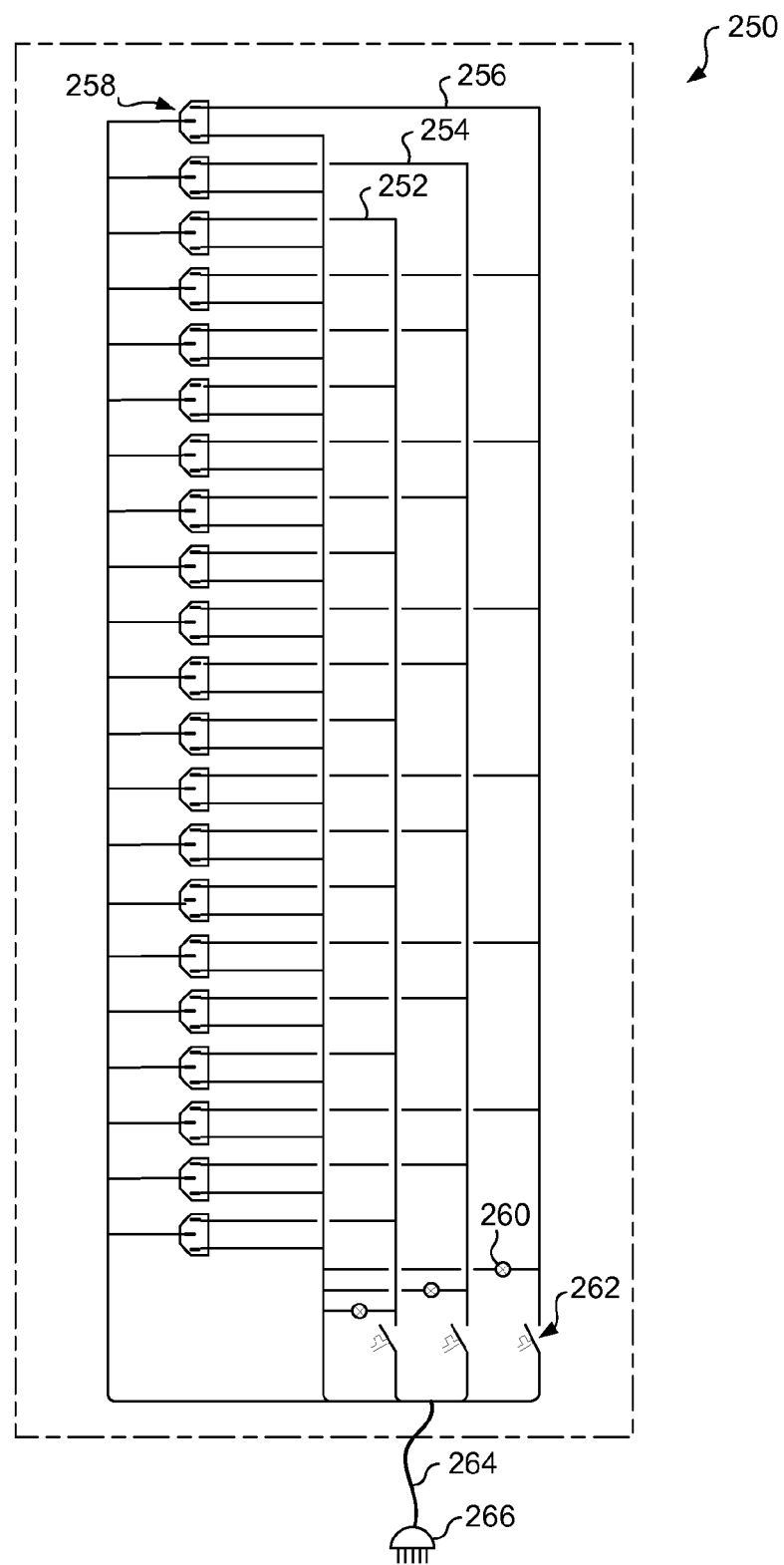
FIG. 7 is a schematic diagram illustrating one embodiment of a power distribution unit.

FIG. 7 illustrates a schematic diagram illustrating one embodiment of a power distribution unit. Power distribution unit 250 includes legs 252, 254, and 256. Each of legs 252, 254, 256 may correspond to one phase of the input power. Legs 252, 254, and 256 of power distribution unit 250 include wiring to receptacles 258. Many receptacles may be provided for each of legs 252, 254, and 256. In one embodiment, seven receptacles are provided for each of legs 252, 254, and 256. The legs of a power distribution unit may, however, include any number of receptacles. Each of legs 252, 254, and 256 include indicator light 260 and breaker 262. In one embodiment, breaker 262 is a 30 A/32 A single pole MCB. Breakers 262 may be located such that they can be accessed when server racks are in-line (e.g., at the top of power distribution unit 250). In one embodiment, power distribution unit includes a 3-phase ground fault protection relay.

Power for legs 252, 254, and 256 may be provided through by way of cable 264 and power connector 266. In one embodiment, cable 264 is an 8 AWG/6 mm² 5 core cable and power connector 266 includes a 30 A NEMA/32 A IEC309 3Ph+N+E Plug. Cable 264 may be located at the bottom of power distribution unit 250. In one embodiment, current for power distribution unit is carried on a 600 volt, 4000 amp aluminum bus.

Figure 10:
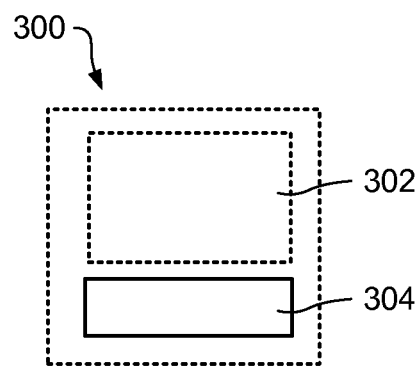
FIG. 10 is a top view illustrating one embodiment of a rack system including a power distribution unit.
Figures 8, 9:
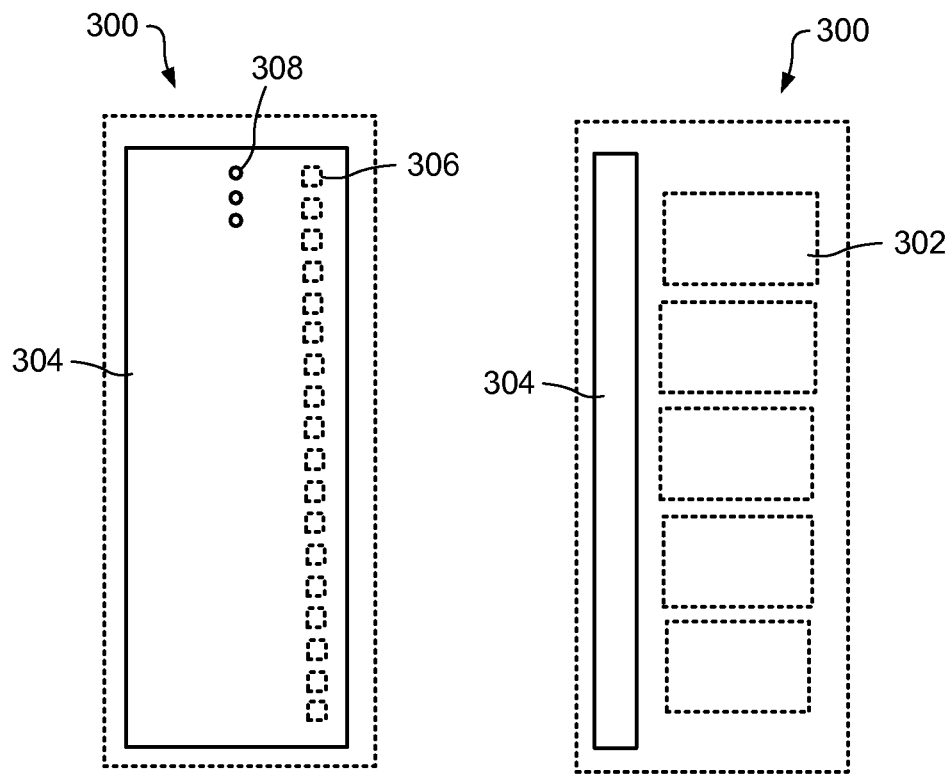
FIG. 8 is a back view illustrating one embodiment of a rack system including a power distribution unit.
FIG. 9 is a side view illustrating one embodiment of a rack system including a power distribution unit.

FIG. 8 is a schematic front view illustrating one embodiment of a rack system including a power distribution unit. FIG. 9 is a schematic side view illustrating the rack shown in FIG. 8. FIG. 10 is a schematic top view illustrating the rack shown in FIG. 8. Rack system 300 includes servers 302 and power distribution unit 304. Servers 302 may be mounted in rack slots on rails at the front rack system 300. Power distribution may be mounted at the of rack system 300. In the embodiment shown in FIG. 8, power distribution unit 304 is shown as being the full height and full width of the space in system 300 (e.g., 36U). In other embodiments, however, a power distribution unit may be only part of the width of rack and/or only a part of the height of the space in the rack. Power distribution unit 304 includes receptacles 306 and indicator lights 308.

In various embodiments, transformer 204 or autotransformer 286 may be physically located, in various embodiments, in a switchgear room, in an electric room, or outside of a data center building. In one embodiment, transformer 204 is part of a transformer system, such as transformer 274 described above relative to FIG. 3. In certain embodiments, a transformer supplying power to a power distribution unit may be located in a rack, such as rack 114 described above relative to FIG. 1.

Figure 11:
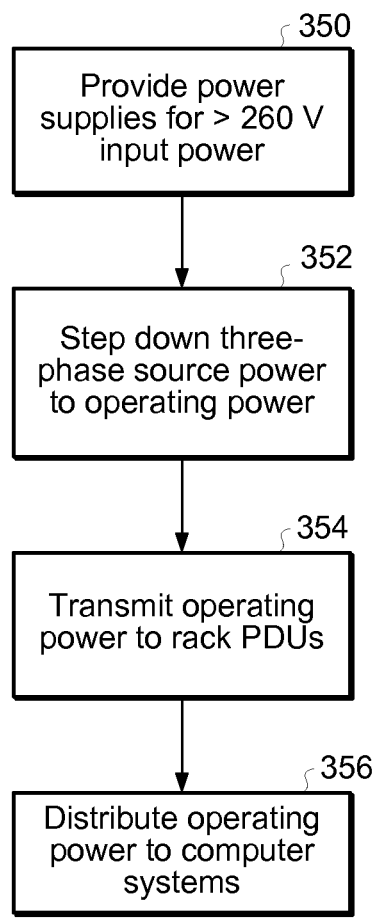
FIG. 11 illustrates supplying power to rack systems in a computer room.

FIG. 11 illustrates supplying power to rack systems in a computer room. At 350, power supplies capable of handling input voltages of at least about 260 volts are provided for a computer room. At 352, source power from a source power feed is stepped down to three-phase operating power. In one embodiment, the three-phase source power is at a line-to-line voltage of about 480 V. In one embodiment, the operating power is at a phase-to-line voltage between about 277 volts. At 354, the three-phase operating power is transmitted through power distribution units. At 356, operating power is distributed to power supplies for the computer systems by way of the power distribution units.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
    one or more computer systems in one or more racks in a computer room, the one or more computer systems comprising at least one power supply configured to operate at an input voltage of at least about 260 volts;
    one or more transformers configured to transform three-phase source power to three-phase operating power comprising three phases and a neutral, at a phase-to-neutral operating voltage on each leg of at least about 260 volts; and one or more power distribution units in at least one of the one or more racks, the one or more power distribution units being coupled to at least one of the one or more transformers, wherein at least one of the one or more power distribution units is configured to supply operating power from the transformer to the at least one power supply at the phase-to-neutral operating voltage of at least about 260 volts.

2. The data center of claim 1, wherein the source power is a utility feed, wherein the one or more transformers include only one transformer coupled between the utility feed and the power distribution units.

3. The data center of claim 1, wherein at least one of the one or more transformers configured to transform three-phase source power to three-phase operating power is located outside the computer room.

4. The data center of claim 1, wherein the line-to-line voltage of the operating power to the power distribution units is about 480 volts, the phase-to-neutral voltage of the operating power to the power distribution units is about 277 volts, and the phase-to-neutral voltage of the operating power to the at least one power supply is about 277 volts.

5. The data center of claim 1, wherein the operating power is output from a single transformer stage of a power distribution system, wherein the single transformer stage receives input from a utility feed.

6. The data center of claim 1, wherein the transformer comprises secondary windings in a Y configuration.

7. The data center of claim 1, wherein the source power is output from a delta transformer.

8. The data center of claim 1, wherein at least one of the power distribution units is configured to receive the operating power from the transformer at the phase-to-neutral operating voltage on each leg of at least 260 volts, and supply operating power from the transformer to power supply units in a plurality of computer systems in the data center at the phase-to-neutral operating voltage of at least 260 volts.

9. The data center of claim 1, wherein the phase-to-neutral voltage of the operating power received in the one or more power distribution units is between about 267 volts and about 287 volts, and wherein the operating power supplied from the one or more power distribution units to the power supply units in the computing systems is between about 267 volts and about 287 volts.

10. The data center of claim 1, wherein the phase-to-neutral voltage of the operating power to the power distribution units is below the maximum input voltage specification for at least one power supply for the computer systems.

11. The data center of claim 1, wherein at least one of the transformers is located outside the computer room.

12. The data center of claim 1, wherein at least one of the transformers is an autotransformer.

13. The data center of claim 1, further comprising an autotransformer configured to drive a neutral for at least one of the power distribution units.

14. The data center of claim 1, wherein at least one of the transformers comprises a three-phase autotransformer configured to transform three-phase source power to three-phase operating power comprising three phases and a neutral, wherein at least one of the one or more power distribution units is coupled to the three-phase autotransformer, wherein at least one of the power distribution units is configured to supply operating power from the three-phase autotransformer to a plurality of computer systems in the data center.

15. A method of supplying power to computer systems in a computer room of a data center, comprising:
providing, for at least one of the computer systems, one or more power supplies configured to receive input voltages of at least about 260 volts;
stepping down three-phase source power from a source power feed to three-phase operating power having a phase-to-neutral voltage at least about 260 volts;
transmitting the three-phase operating power at the at least 260 volts phase-to-neutral voltage to one or more power distribution units in the computer room; and
distributing operating power from the one or more power distribution units to at least one of the power supplies at the phase-to-neutral operating voltage of at least about 260 volts.

16. The method of claim 15, wherein the source power is a utility feed, wherein the three-phase source power is stepped down to three-phase operating power in a single transformer stage.

17. The method of claim 15, wherein the source power is stepped down to operating power outside of the computer room.

18. The method of claim 15, wherein the phase-to-neutral voltage of the operating power received in the one or more power distribution units is between about 267 volts and about 287 volts, and wherein the operating power supplied from the one or more power distribution units to the power supply units in the computing systems is between about 267 volts and about 287 volts.

19. The method of claim 15, wherein the phase-to-neutral voltage of the operating power to the power distribution units is below the maximum input voltage specification for at least one power supply for the computer systems.

* * * * *